(12) United States Patent
Pulvirenti et al.

(10) Patent No.: US 10,720,921 B2
(45) Date of Patent: Jul. 21, 2020

(54) DRIVE CIRCUIT FOR HALF-BRIDGES, CORRESPONDING DRIVER, DEVICE AND METHOD

(71) Applicant: STMicroelectronics S.r.l., Agrate Brianza (IT)

(72) Inventors: Francesco Pulvirenti, Acireale (IT); Salvatore Cassata, Palermo (IT); Salvatore Giuseppe Privitera, Paterno (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/375,233

(22) Filed: Apr. 4, 2019

(65) Prior Publication Data

US 2019/0319617 A1    Oct. 17, 2019

(30) Foreign Application Priority Data

Apr. 11, 2018   (IT) .................. 102018000004400

(51) Int. Cl.
*H02M 3/337*    (2006.01)
*H03K 17/687*   (2006.01)
*G01R 19/00*    (2006.01)
*H03K 17/16*    (2006.01)

(52) U.S. Cl.
CPC ..... *H03K 17/6871* (2013.01); *G01R 19/0092* (2013.01); *H03K 17/163* (2013.01)

(58) Field of Classification Search
CPC ............ H02M 3/33515; H02M 3/157; H02M 3/33576; H02M 2001/0012; H02M 2001/007; H02M 3/337
See application file for complete search history.

(56) References Cited

U.S. PATENT DOCUMENTS

| 2001/0036085 | A1* | 11/2001 | Narita ................ H02M 3/1588 363/16 |
| 2010/0259954 | A1 | 10/2010 | Santoro et al. |
| 2017/0222638 | A1 | 8/2017 | Gariboldi |

FOREIGN PATENT DOCUMENTS

EP    0 315 597 A2    5/1989
WO    2016/198302 A1  12/2016

* cited by examiner

*Primary Examiner* — Sibin Chen
(74) *Attorney, Agent, or Firm* — Seed IP Law Group LLP (57) ABSTRACT

A dead-time circuit includes a signal propagation path from a first input node receiving a PWM modulated control signal to an output node, such signal propagation path switchable between a non-conductive state and a conductive state, such that the signal at the first input node is transferred to the output node when the signal propagation path is in the conductive state. The dead-time circuit further includes a differentiator circuit block coupled to a second input node and to the signal propagation path, the second input node configured to be coupled to an intermediate node of a half-bridge circuit. The differentiator circuit block switches the signal propagation path between the non-conductive state and the conductive state as a function of a time derivative of a signal at the second input node. At least one time-delay circuit component delays transfer of the signal at the first input node to the output node.

19 Claims, 8 Drawing Sheets

DRIVE CIRCUIT FOR HALF-BRIDGES, CORRESPONDING DRIVER, DEVICE AND METHOD

BACKGROUND

Technical Field

The present description relates generally to circuits and methods for driving half-bridge arrangements, which may be applied, for instance, to driving components for consumer electronics and industrial controls, as well as DC motor controls.

Description of the Related Art

Half-bridges are a class of circuits which may be used for driving components for consumer electronics and industrial controls. For instance, they may be involved in the technologies related to, e.g., control of DC motors.

Conventional half-bridge (e.g., H-bridge) driving circuits may involve generating and applying to the control signals fed to the input terminals of an H-bridge circuit a so-called "dead time", in order to reduce the occurrence of undesirable "shoot-through" (or "cross-conduction") phenomena.

Such shoot-through phenomena may result from both the high-side and the low-side power transistors of a same side of an H-bridge circuit (that is, a half-bridge circuit) being concurrently in a conductive state. Such concurrent activation of both the high-side and the low-side power transistors in a half-bridge circuit may provide a low-resistance current path between the supply voltage node and ground, therefore allowing a potentially dangerous "shoot-through current" to flow therethrough. Such shoot-through current may lead to an increase of the temperature of the power transistors of a half-bridge circuit during operation, potentially leading to their failure.

Insertion of a dead time, that is a time lapse in which both power transistors in a half-bridge are commanded off at commutations of the H-bridge circuit, may facilitate reducing the occurrence of such shoot-through phenomena by preventing one power transistor in the half-bridge (e.g., the high-side or the low-side power transistor) from switching on before the other power transistor in the half-bridge (e.g., the low-side or the high-side power transistor, respectively) is (completely) turned off.

Insertion of a dead time may otherwise result in a decrease of the efficiency of the motor-driver system, as a result of power dissipating in the body diodes of the power transistors of an H-bridge circuit during the time in which both power transistors in a half-bridge are in a non-conductive state. In fact, a predominantly inductive load of the H-bridge circuit, e.g., a DC motor, may allow a current to flow in the power transistors of the H-bridge circuit even when such transistors are in a non-conductive state.

BRIEF SUMMARY

One or more embodiments of the present disclosure contribute to providing improved solutions which may overcome the shortcomings of such prior approaches.

For instance, solutions are desirable which may facilitate, e.g., realizing H-bridge driving circuits with an improved dead time generation circuit which increases the power efficiency of the motor-driver system, e.g., by shortening the time during which both power transistors in a half-bridge are in a non-conductive state.

One or more embodiments may relate to a corresponding driver, e.g., including a pair of circuits for driving the high-side and the low-side switches, respectively, of a half-bridge arrangement.

One or more embodiments may relate to a corresponding device, combining such a driver and a half-bridge arrangement driven thereby.

One or more embodiments may relate to a corresponding method.

The claims are an integral part of the technical teaching provided herein in respect of the embodiments.

One or more embodiments may provide a hardware solution, capable of adapting "on the fly" the dead time duration in an H-bridge driving circuit in order to improve the power efficiency of a corresponding motor-driver system.

One or more embodiments may rely on measurements of voltage values at certain nodes of the H-bridge circuit for adapting the dead time, e.g., using a feedback loop.

One or more embodiments may address the issues of known "adaptive" dead time circuits, e.g., the sensing of noisy switching voltages and the need for high-speed voltage comparators.

One or more embodiments may facilitate "on the fly" adjustment of the dead time duration for different types of power transistors used in an H-bridge circuit (e.g., power MOSFETs).

One or more embodiments may also facilitate "on the fly" adjustment of the dead time duration for different temperature and/or operating conditions of the driving circuit and/or of the H-bridge circuit coupled thereto.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1A:
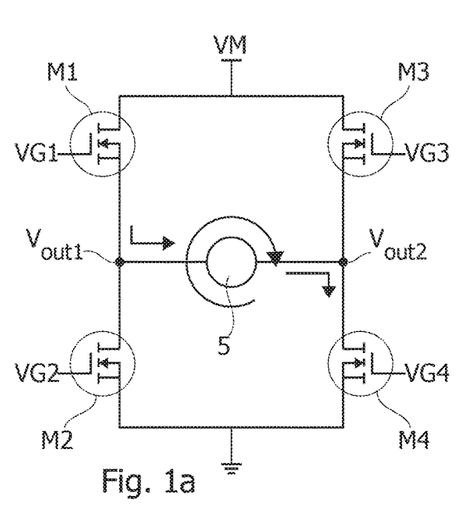
FIGS. 1a and 1b, which are exemplary of a possible context of use of embodiments in two operating conditions.
Figure 1B:
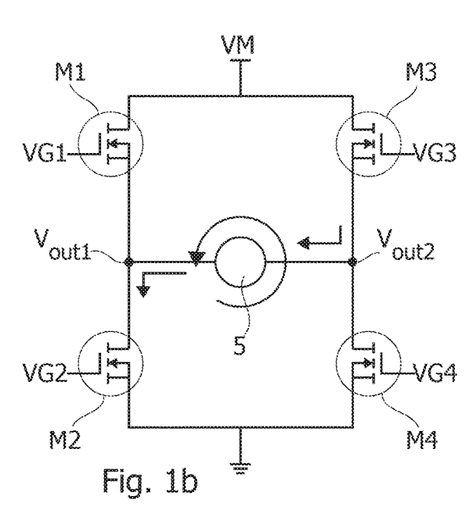

FIGS. 1a and 1b are simplified circuit diagrams exemplary of a conventional switching bridge circuit (or H-bridge circuit) in two different operating conditions.

An H-bridge circuit may comprise a load 5 (e.g., a DC motor) and four switches M1, M2, M3, M4 for driving the load 5, arranged in a configuration as exemplified in FIG. 1. Such configuration is conventional in the art, thus making it unnecessary to provide a more detailed description herein.

Switches M1, M2, M3, M4 may be implemented, for instance, as power transistors.

In the present description, Metal-Oxide-Semiconductor Field Effect Transistors (MOS FETs) will be considered when referring to transistors M1, M2, M3, M4. However, driving circuits similar to those disclosed herein may be used for driving H-bridge circuits comprising other types of transistors (e.g., BJT transistors) or other types of switches in place of power transistors M1, M2, M3, M4.

FIG. 1a is exemplary of an H-bridge circuit in a first operating condition, in which transistors M1 and M4 are in a conductive state (ON state) and transistors M2 and M3 are in a non-conductive state (OFF state). In such operating condition, the voltage at the node $V_{out1}$ is close to the supply voltage VM and the voltage at the node $V_{out2}$ is close to ground voltage (typically, 0 V). Therefore, a current can flow through the load 5 from node $V_{out1}$ to node $V_{out2}$. In case the load 5 is a DC motor, such current may cause the DC motor to rotate, e.g., in clockwise direction.

FIG. 1b is exemplary of an H-bridge circuit in a second operating condition, in which transistors M2 and M3 are in a conductive state and transistors M1 and M4 are in a non-conductive state. In such operating condition, the voltage at the node $V_{out1}$ is close to ground voltage (e.g., 0 V) and the voltage at the node $V_{out2}$ is close to the supply voltage VM. Therefore, a current can flow through the load 5 from node $V_{out2}$ to node $V_{out1}$. In case the load 5 is a DC motor, such current may cause the DC motor to rotate in the opposite direction with respect to the above-mentioned first operating condition, e.g., in counter-clockwise direction.

For the sake of simplicity, same designations (e.g., $V_{out1}$, $V_{out2}$) will be used throughout the present description as references for nodes in circuits and corresponding signals which may apply at such nodes.

As exemplified in FIG. 1, transistors M1, M2, M3, M4 may be n-type MOS transistors. It will be otherwise noted that such transistors may also be p-type MOS transistors, and that both n-type and p-type MOS transistors may be present in a same H-bridge circuit.

A driving circuit (not visible in FIGS. 1a and 1b) may be provided for generating control signals for operating the switches M1, M2, M3, M4.

In case such switches are MOS transistors, such control signals may correspond to gate control signals VG1, VG2, VG3, VG4 applied to the respective gate terminals of transistors M1, M2, M3, M4 as exemplified in FIG. 1. Such gate control signals may be generated by one or more driving circuits in order to operate (e.g., switch on and switch off) the transistors M1, M2, M3, M4, thereby operating the load 5 (e.g., a DC motor).

Such driving circuits may involve generating and inserting a "dead time" in the signals applied to the (gate) control terminals of the power transistors M1, M2, M3, M4. Such dead time may facilitate a transistor in a half-bridge circuit switching off (completely) before the other transistor in the same half-bridge circuit turns on.

As a result of such dead time being too short, a transistor may switch on before the other transistor in the same half-bridge circuit is (completely) switched off, therefore allowing a shoot-through current to flow from the supply voltage node VM to ground through the current path provided by such two transistors being concurrently in a (at least partially) conductive state.

Conversely, as a result of such dead time being too long, the efficiency of the motor-driver system may decrease, since power may dissipate in the body diodes (not visible in FIG. 1) of power transistors M1, M2, M3, M4 during the time in which both transistors of a same half-bridge are in a non-conductive state. In fact, a (predominantly) inductive load 5 (as provided, e.g., by a DC motor) may allow a current to flow in the body diodes of the power transistors M1, M2, M3, M4 when such transistors are in a non-conductive state.

Several driving circuits for H-bridge circuits address the issue of generating and inserting a dead time in the control signals applied to the control terminals of transistors M1, M2, M3, M4.

Different circuits and methods may rely on a fixed dead time, or a programmable dead time, or a dead time based on the sensing of switching voltages.

Figure 2:
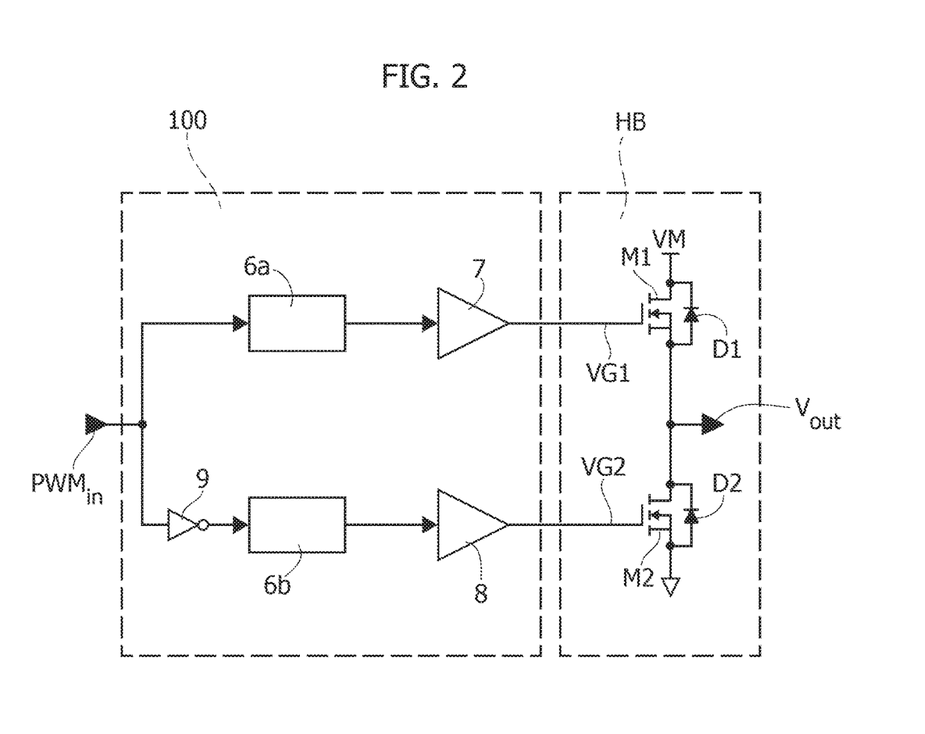
FIG. 2 is an exemplary block diagram of a circuit for driving a half-bridge circuit.

FIG. 2 is an exemplary block diagram of a driving circuit 100 for driving a half-bridge circuit HB according to a fixed dead time topology.

In such a circuit, a constant dead time duration may be applied to the control signals fed to the control terminals VG1, VG2 of the driving transistors M1, M2 in the half-bridge circuit HB.

It will be noted that, despite FIG. 2 being illustrative of a drive circuit for driving transistors M1 and M2, a similar drive circuit may be used for driving transistors M3 and M4 in a complementary way, according to the operational schemes exemplified in FIG. 1.

As a result of the dead time duration applied to the control signals VG1 and VG2 being fixed, and therefore not adaptable to possible process, voltage and temperature (PVT) variations, the efficiency of the motor-driver system may decrease.

A driving circuit 100 as exemplified in FIG. 2 may comprise:

an input node $PWM_{in}$;
an inverter 9 coupled to the input node $PWM_{in}$;
a dead time circuit block 6a coupled to the input node $PWM_{in}$;
a dead time circuit block 6b coupled to the output of the inverter 9;
a high-side driver circuit block 7 coupled to the output of the dead time circuit block 6a and having an output node VG1; and
a low-side driver circuit block 8 coupled to the output of the dead time circuit block 6b and having an output node VG2.

In the driving circuit 100 as exemplified in FIG. 2, the propagation of the input signal $PWM_{in}$ to the output control terminals VG1, VG2 may be selectively delayed by means of the dead time circuit blocks 6a, 6b.

Such selective (e.g., with respect to only rising or falling edges of the input signal $PWM_{in}$, respectively for the high-side control signal VG1 and the low-side control signal VG2) insertion of delays in the control signals VG1, VG2 may result in a dead time at each commutation of the half-bridge circuit HB. During such dead time, neither the high-side transistor M1 nor the low-side transistor M2 are in a conductive state. Hence, the possibility of a shoot-through current flowing through transistors M1 and M2 may be reduced.

In a circuit as exemplified in FIG. 2, the duration of the dead time may be determined by the implementation of the dead time circuit blocks 6a, 6b. For instance, such dead time circuit blocks may comprise chains of inverters.

Inverters in such chains of inverters may be sized in order to receive a significant under-drive from respective previous stages. Such sizing of the inverters may facilitate providing a delayed propagation of the input signal $PWM_{in}$ to the output terminals VG1, VG2 according to the signals exemplified in FIG. 3, and may also provide larger inverters to drive the large (MOS) power transistors M1, M2.

Driving circuits 100 as exemplified in FIG. 2, providing a fixed dead time, may be comprised in microcontrollers and PWM generation integrated circuits.

Figure 3:
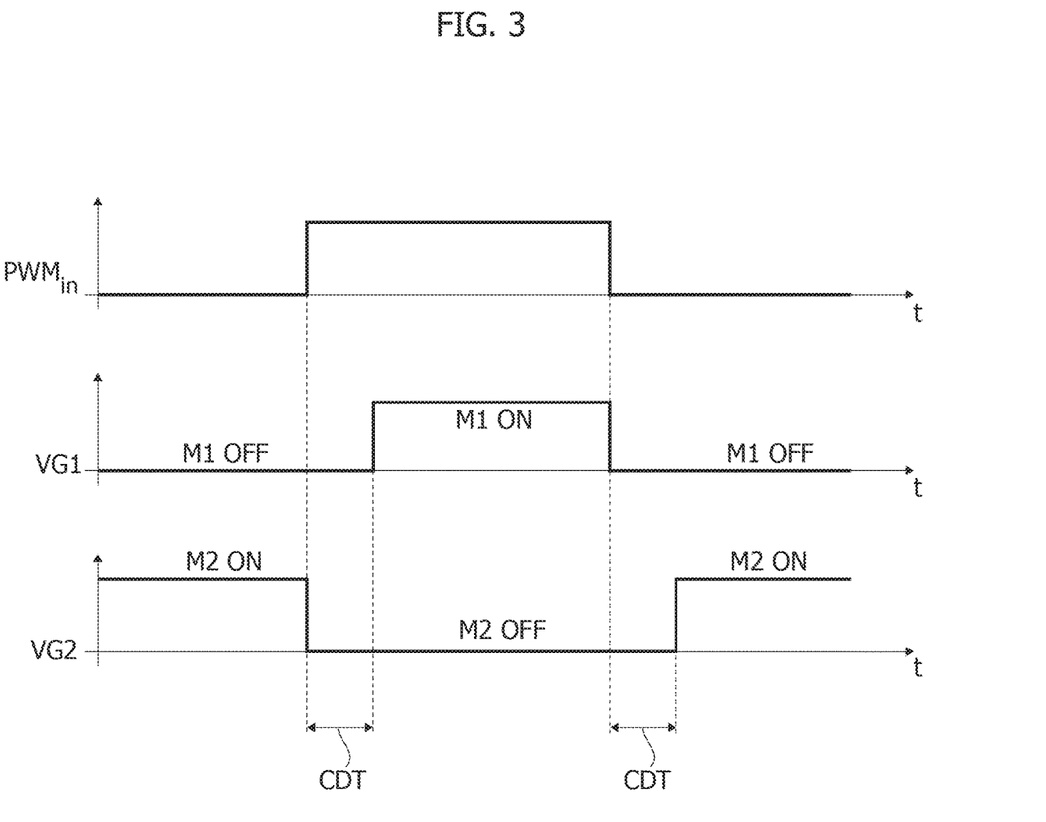
FIGS. 3 and 4 are diagrams exemplary of possible time behavior of signals in driving circuits for half-bridge circuits.

FIG. 3 is a diagram exemplary of possible time behavior of signals in a driving circuit 100. The signal $PWM_{in}$ may be fed to the input node $PWM_{in}$ of the circuit 100. Signals VG1 and VG2 may be provided at the output nodes VG1 and VG2, respectively, of the driving circuit 100.

As exemplified in FIG. 3, a rising (low-to-high) edge of the input signal $PWM_{in}$ may result in a falling (high-to-low) edge of the signal VG2 and a delayed rising edge of the signal VG1, therefore causing the (n-type) transistor M1 to switch on after the on-to-off commutation of the (n-type) transistor M2 is presumably completed.

Similarly, a falling edge of the input signal $PWM_{in}$ may result in a falling edge of the signal VG1 and a delayed rising edge of the signal VG2, therefore causing the (n-type) transistor M1 to (completely) switch off before the (n-type) transistor M2 switches on.

It will be appreciated that, after any edge of the input signal $PWM_{in}$ (either rising or falling), both control signals VG1 and VG2 are low for a certain period of time, which is the so-called control dead time CDT, as exemplified in FIG. 3.

Transistors may require some time in order to complete switching transitions (both on-to-off and off-to-on transitions). Therefore, the operating state of a transistor (conductive or non-conductive) does not change immediately as a result of a change of the value of its gate control signal.

As a result of the control dead time CDT being longer than the switching time ST (in particular, the switch-off time) of transistors M1 and M2, both transistors M1 and M2 will be in a non-conductive state for a certain time lapse at each commutation of the half-bridge arrangement HB. Such time lapse may be regarded as the "effective" dead time EDT.

With reference to FIG. 3, the control dead time CDT is representative of the time that may elapse between the instant when a first transistor in a half-bridge circuit is commanded off, and the instant when the second transistor in the half-bridge is commanded on.

Due to the transistors requiring some time ST for (completely) switching off, a time lapse shorter than the control dead time CDT may elapse between the instant when the first transistor completes the on-to-off commutation and the instant when the second transistor is commanded on. Such time is the effective dead time EDT, and the relationship between control dead time CDT, effective dead time EDT and transistor switching time ST may be expressed as EDT=CDT−ST.

The control dead time CDT may be conventionally set in order to result in the effective dead time EDT being positive, that is, in order to avoid cross-conduction phenomena.

In the case of fixed dead time control circuits as exemplified in FIG. 2, since calculation of the control dead time CDT is conventionally based on a worst case scenario for the transistor switching time ST, the effective dead time EDT may turn out to be a significant portion of the control dead time CDT in many of the operating conditions of the circuit.

It will be noted that, referring to n-type MOS transistors herein is just for the sake of brevity and ease of explanation. P-type MOS transistors may be involved as well, which are in a conductive state when the gate control signal is at a low logic level, and are in a non-conductive state when the gate control signal is at a high logic level.

In case the H-bridge circuit HB comprises p-type MOS transistors, the dead time insertion scheme may be modified accordingly, e.g., in order to have both control signals VG1 and VG2 being high after each edge of the signal $PWM_{in}$. Such behavior may be obtained, for instance, by complementing the logic values of signals VG1 and VG2 by inserting inverters between the output nodes of the driver circuit 100 and the respective gate nodes of the transistors M1, M2.

Circuits as exemplified in FIG. 2 do not provide a possibility to tune the duration of the control dead time CDT, which is fixed. In fact, duration of the control dead time in such circuits depends on the circuit architecture of the dead time circuit blocks 6a and 6b.

Therefore, in such circuits, duration of the control dead time CDT may be commonly determined through trials. In some cases, additional margin may be added to the control dead time determined through trials. Such additional margin may be helpful in taking into account a worst case scenario, e.g., in terms of process, voltage, temperature and load variations.

Choosing a long control dead time duration may result in shoot-through events not occurring during operation of the motor-driver system.

Figure 4:
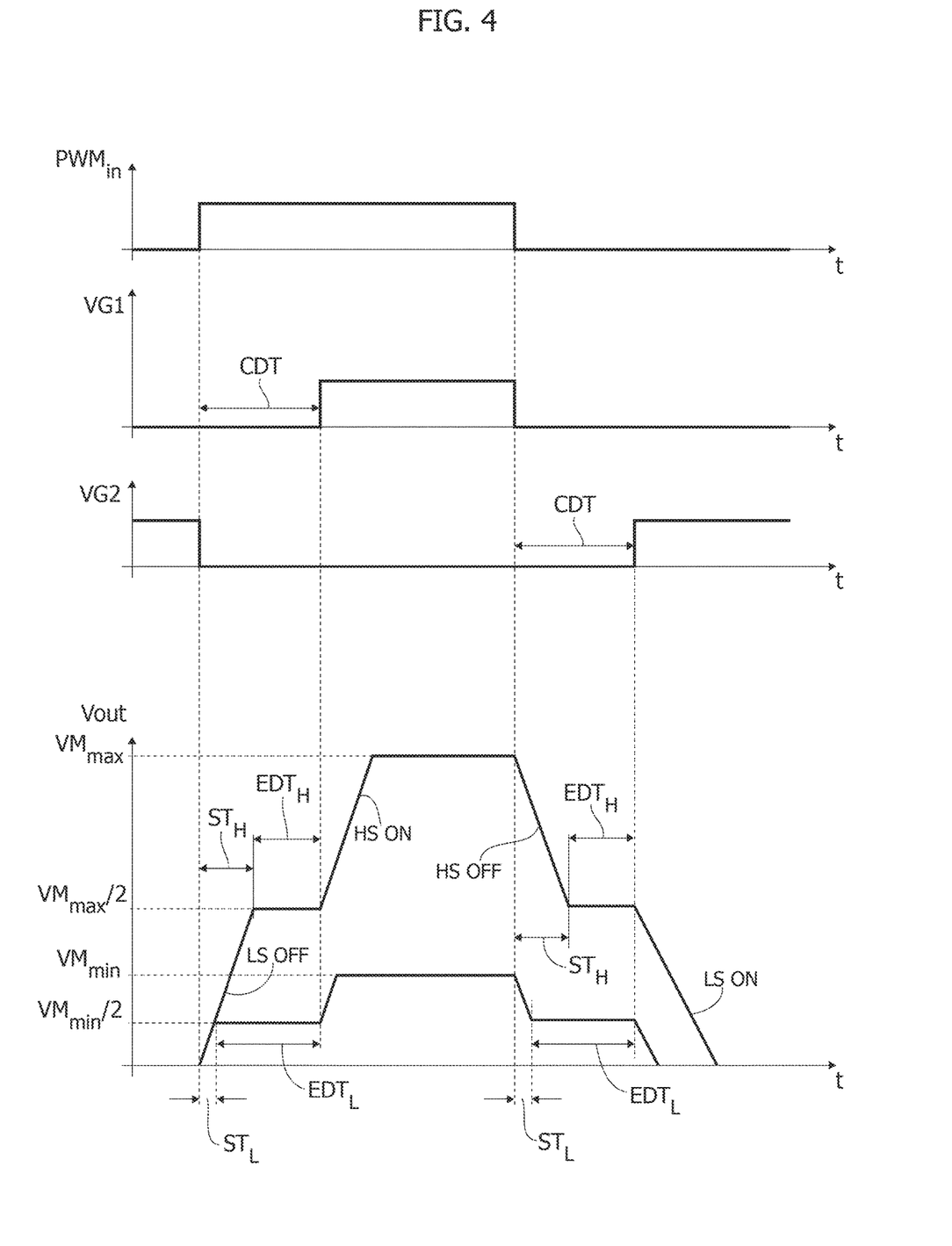

The duration of the control dead time CDT may be chosen also as a function of the value of the supply voltage VM, since a higher supply voltage VM may require a longer control dead time CDT in order to result in a positive effective dead time EDT, as exemplified in FIG. 4.

FIG. 4 is a diagram exemplary of possible time behavior of signals at the input node $PWM_{in}$, at the control nodes VG1 and VG2, and at the output node $V_{out}$ of a circuit as exemplified in FIG. 2, for two possible values of the half-bridge supply voltage $VM_{max}$ and $VM_{min}$, with $VM_{max} > VM_{min}$.

As noted, a rising edge of the input signal $PWM_{in}$ may trigger (almost immediately) an on-to-off transition of the low-side (LS) transistor M2, thus letting the output voltage $V_{out}$ increase from 0 V to VM/2. The output voltage $V_{out}$ reaching the value VM/2 may be indicative of the low-side transistor M2 having completed the on-to-off transition, and the high-side (HS) transistor M1 being still in a non-conductive state. At this point, the high-side transistor M1 can be switched on, and the output voltage $V_{out}$ can reach the value VM as a result of the high-side transistor M1 completing the off-to-on transition.

Similarly, a falling edge of the input signal $PWM_{in}$ may trigger (almost immediately) an on-to-off transition of the high-side transistor M1, thus letting the output voltage $V_{out}$ decrease from VM to VM/2. The output voltage $V_{out}$ lowering to the value VM/2 may be indicative of the high-side transistor M1 having completed the on-to-off transition, and the low-side transistor M2 being still in a non-conductive state. At this point, the low-side transistor M2 can be switched on, and the output voltage $V_{out}$ can decrease from the value VM/2 to the ground voltage (e.g., 0 V) as a result of the low-side transistor M2 completing the off-to-on transition.

Driving circuits involving a fixed dead time as exemplified in FIG. 2 may adopt a quite long control dead time CDT in order to facilitate shoot-through protection also for large values of the supply voltage VM, which may result in a longer switching time ST. This may otherwise result in a low efficiency of the motor-driver system when the value of the supply voltage VM is rather low and such a long dead time duration may be unnecessary.

FIG. 4 is exemplary of such a case, in which a certain duration of the control dead time CDT results in a long and short duration $EDT_L$ and $EDT_H$, of the effective dead time for low and high values of the supply voltage VM, respectively. This is a result of the power transistors M1, M2 having a long and short switching time $ST_H$ $ST_L$ in the case of high and low values of the supply voltage VM, respectively.

Figure 5:
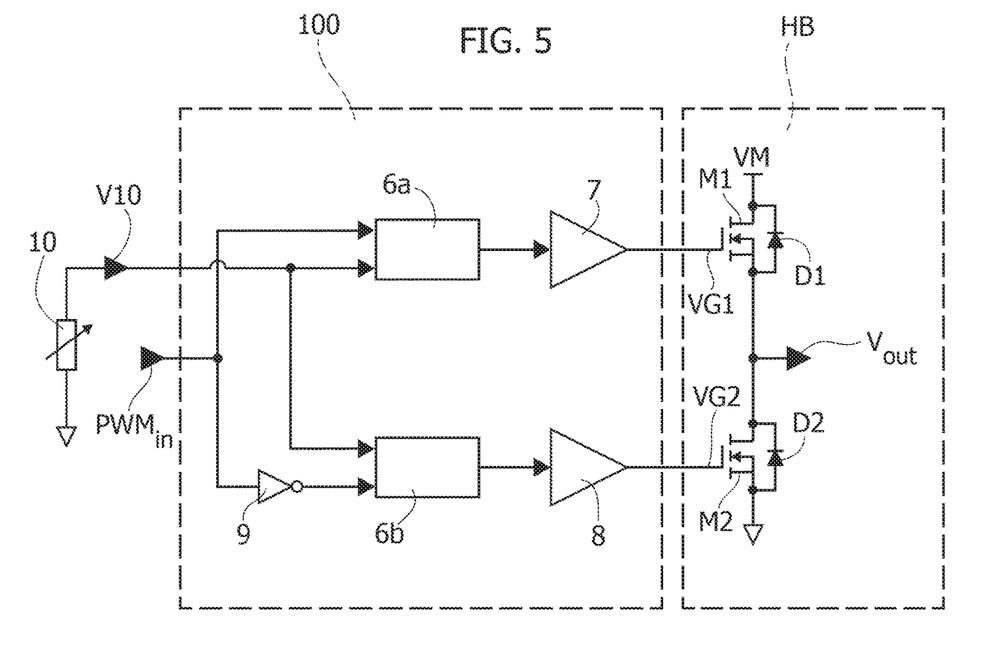
FIG. 5 is an exemplary block diagram of a circuit for driving a half-bridge circuit.

FIG. 5 is an exemplary block diagram of a different circuit 100 for driving a half-bridge circuit HB.

Throughout the figures annexed herein, like parts or elements are indicated with like references/numerals and a corresponding description will not be repeated for brevity.

A driving circuit 100 as exemplified in FIG. 5 differs from a circuit 100 as exemplified in FIG. 2 in that it has an additional input terminal V10, such input terminal V10 being coupled to respective additional input nodes of the dead time circuit blocks 6a and 6b.

A circuit as exemplified in FIG. 5 may provide a possibility to vary the duration of the control dead time CDT by varying the value of an external component 10 (e.g., an external resistor), such external component being coupled, e.g., between the input node V10 and ground.

Circuits as exemplified in FIG. 5 can be regarded as circuits adopting a programmable dead time.

For instance, duration of the control dead time CDT may be tuned by changing the value of an external variable resistor 10, which may result in a change of the value of a current internal to the dead time circuit blocks 6a, 6b. For instance, a linear relationship between the value of such variable resistor 10 and the duration of the control dead time CDT may be assumed.

Such programmable dead time circuits may suffer from some disadvantages.

A first disadvantage may be represented by the (direct) relationship between the value of the external component 10 and the duration of the control dead time CDT. In fact, as a consequence of such (direct) relationship, such circuits may be affected by noise injection from the dead time setting terminal V10 of the circuit 100. For instance, unwanted variations and uncertainties of the value of the resistance of an external resistor 10 may generate undesirable variations of the duration of the control dead time CDT.

A second disadvantage of programmable dead time circuits as exemplified in FIG. 5 may be represented by the fact that the duration of the control dead time CDT may be dependent on values of both internal and external components, which may have independent individual variations related to different implementation technologies. Therefore, achieving precise values of the control dead time duration may be difficult.

Another disadvantage of programmable dead time circuits may be represented by the fact that internal and external circuits, which may determine the control dead time duration, may have different dependency on temperature and/or voltage variations. Therefore, achieving precise values of the control dead time duration may be difficult, e.g., in the presence of temperature variations and/or voltage variations during operation of the driver-motor system.

It is noted that dead time generation circuits based on the measurement of switching voltages may facilitate overcoming some of the disadvantages of the previously described solutions.

Such switching voltage sensing dead time generation circuits may be adaptive or predictive.

Predictive dead time generation circuits may use information from a previous switching cycle to set an adjusted control dead time duration for the next cycle.

Adaptive dead time generation circuits may facilitate adjusting the duration of the control dead time CDT "on the fly" depending on the measurement of a switching voltage, e.g., across a synchronous rectifier.

An adaptive dead time generation circuit may comprise a (logic) circuit configured for measuring the drain-to-source voltages $V_{DS1}$ and $V_{DS2}$ at the power transistors M1 and M2, respectively, of a half-bridge circuit HB, and detecting the instants when such drain-to-source voltages $V_{DS1}$ and $V_{DS2}$ reach the zero-voltage threshold, possibly becoming negative. As a result either of the drain-to-source voltages $V_{DS1}$, $V_{DS2}$ of transistors M1, M2 reaching the zero-voltage threshold, current conduction in the respective body diode D1, D2 may be avoided by turning on the respective transistor M1, M2.

For instance, as a result of the high-side transistor M1 turning off, the voltage at the node $V_{out}$ may drop from VM to 0 V, and possibly (slightly) below 0 V, provided an inductive load 5 is connected to the output node $V_{out}$. Thus, the drain-to-source voltage $V_{DS2}$ of transistor M2 may switch from positive to zero, and possibly to a negative value. A (high-speed) voltage comparator may detect such zero-voltage crossing of the drain-to-source voltage $V_{DS2}$, and the low-side transistor M2 may be consequently turned on to facilitate avoiding current conduction in the respective body diode D2.

Similarly, as a result of the low-side transistor M2 turning off, the voltage at the node $V_{out}$ may increase from 0 V to VM, and possibly (slightly) above VM, provided an inductive load 5 is connected to the output node $V_{out}$. Thus, the drain-to-source voltage $V_{DS1}$ of the high-side transistor M1 may drop to a negative value and the body diode D1 may be forward biased. A (high-speed) voltage comparator may detect such zero-voltage crossing of the drain-to-source voltage $V_{DS1}$, and the high-side transistor M1 may be consequently turned on to facilitate avoiding current conduction in the respective body diode D1.

Such adaptive dead time generation circuits may still exhibit some drawbacks, e.g., relying on sensing noisy switching voltages and the need for high-speed voltage comparators.

Figure 6:
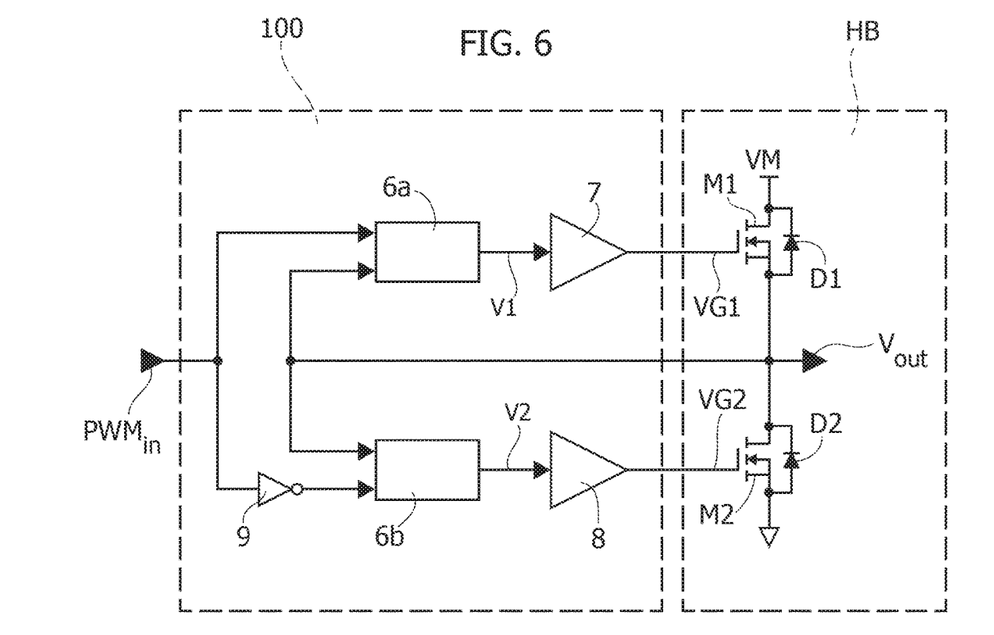
FIG. 6 is an exemplary block diagram of a circuit architecture of embodiments of the present disclosure.

FIG. 6 is a block diagram exemplary of one or more embodiments, which aim at providing an improved solution in view of the above-mentioned drawbacks of other driving circuits for half-bridge circuits.

A circuit 100 as exemplified in FIG. 6 differs from a circuit 100 as exemplified in FIG. 2 in that it has an additional input node $V_{out}$, such input node $V_{out}$ being coupled to respective additional input nodes of the dead time circuit blocks 6a, 6b and receiving a signal from the node $V_{out}$ of the half-bridge HB.

In one or more embodiments as exemplified in FIG. 6, an adaptive duration of the control dead time CDT may be sought by resorting to a feedback loop which senses the voltage signal at the node $V_{out}$ of the half-bridge HB, and feeds such signal as an input to the dead time circuit blocks 6a, 6b.

As discussed in the foregoing, the dead time circuit blocks 6a, 6b may be different, e.g., in order to provide delayed propagation of the input signal $PWM_{in}$ to the output terminals V1, V2 with respect to (only) rising or falling edges of the input signal $PWM_{in}$, respectively, as exemplified in FIG. 3.

It will be noted that circuit blocks 6a, 6b provide their output signals at nodes V1, V2 of the circuit 100, respectively. Such nodes V1, V2 are coupled to the gate control terminals VG1, VG2 through driver circuits 7, 8, respectively. Such driver circuits have the purpose of providing the nodes VG1, VG2 with voltage values compatible with the operation of the power transistors M1, M2, but may not alter the logic value of the signals at their input nodes V1, V2. Therefore, in the present description, the logic values of signals V1, V2 may be regarded as indicative of the logic values of control signals VG1, VG2. The same applies for circuits 6a, 6b as exemplified in FIGS. 9, 11, 12, 14 and discussed in the following.

Figure 7:
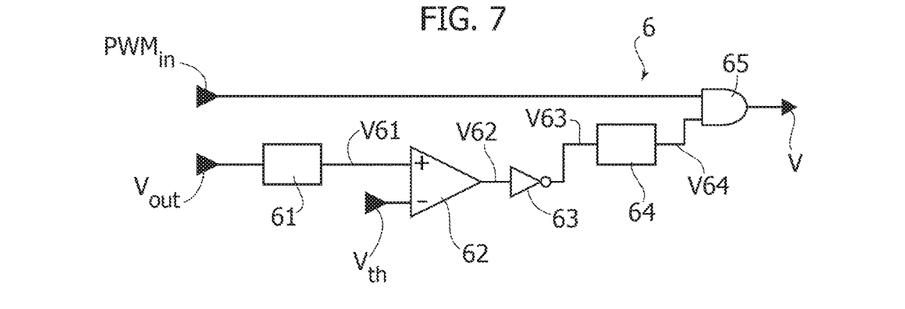
FIG. 7 is an exemplary block diagram of a dead-time generation circuit in embodiments of the present disclosure.

FIG. 7 is an exemplary block diagram of a dead time circuit block 6 (e.g., 6a and/or 6b) in one or more embodiments.

A dead time circuit block 6 as exemplified in FIG. 7 may comprise:
an input node $PWM_{in}$;
an input node $V_{out}$;
a differentiator circuit block 61 coupled to the input node $V_{out}$;
a reference voltage node $V_{th}$;
a voltage comparator 62, having a first input terminal coupled to the output of the differentiator circuit block 61 and a second input terminal coupled to the reference voltage node $V_{th}$;
an inverter 63 coupled to the output of the voltage comparator 62;
a delay circuit block 64 coupled to the output of the inverter 63; and
an AND logic gate 65, having a first input coupled to the input node $PWM_{in}$ and a second input coupled to the output of the delay circuit block 64, and having an output node V.

The differentiator circuit block 61 may provide an output signal V61 indicative of the value of the time derivative of the input signal $V_{out}$. Such signal V61 may be compared with the voltage reference $V_{th}$ in the comparator 62.

In one or more embodiments (e.g., circuit block 6a), as a result of the signal V61 being higher or lower than the threshold $V_{th}$, the output V62 of the comparator 62 may be set to a high or low logic value (e.g., "1", resp. "0"), respectively.

In one or more embodiments (e.g., circuit block 6b), as a result of the signal V61 being lower or higher than the threshold $V_{th}$ the output V62 of the comparator 62 may be set to a high or low logic value (e.g., "1", resp. "0"), respectively.

As a result of the signal V62 being high, the signal V63 at the output of the inverter 63 is low. The signal V64 at the output of the delay circuit block 64 has the same logic level of the signal V63, therefore the input signal $PWM_{in}$ is not propagated to the output node V, since the output signal V is forced to a low value by the AND logic gate 65 having the input signal V64 at a low value. In fact, the signal V62 being high may be indicative of one of the two transistors M1, M2 in the half-bridge HB being operating an on-to-off transition.

Conversely, as a result of the signal V62 being low (and therefore signals V63 and V64 being high), the input signal $PWM_{in}$ may be propagated (with a certain delay) to the output node V. In fact, the signal V62 being low may be indicative of the input voltage $V_{out}$ being constant (e.g., equal to VM/2), and thus both transistors M1, M2 in the half-bridge HB being in a non-conductive state.

The delay circuit block 64 is exemplary of the possibility of delaying the propagation of a high logic value, and therefore of a rising edge, from the input node $PWM_{in}$ to the output node V. A low logic value, that is a falling edge, may otherwise propagate from the input node $PWM_{in}$ to the output node V without delay, independently from the logic value of the signal V64.

A dead time circuit as exemplified in FIG. 7 may therefore facilitate tuning the effective dead time EDT by exploiting the delay circuit block 64. This may be obtained by sensing the voltage $V_{out}$ in order to adapt the control dead time CDT "on-the-fly", in such a way that a (delayed) signal is propagated from the input node $PWM_{in}$ to the output node V for switching on a transistor (only) as a result of the other transistor being (completely) switched off.

Figure 8:
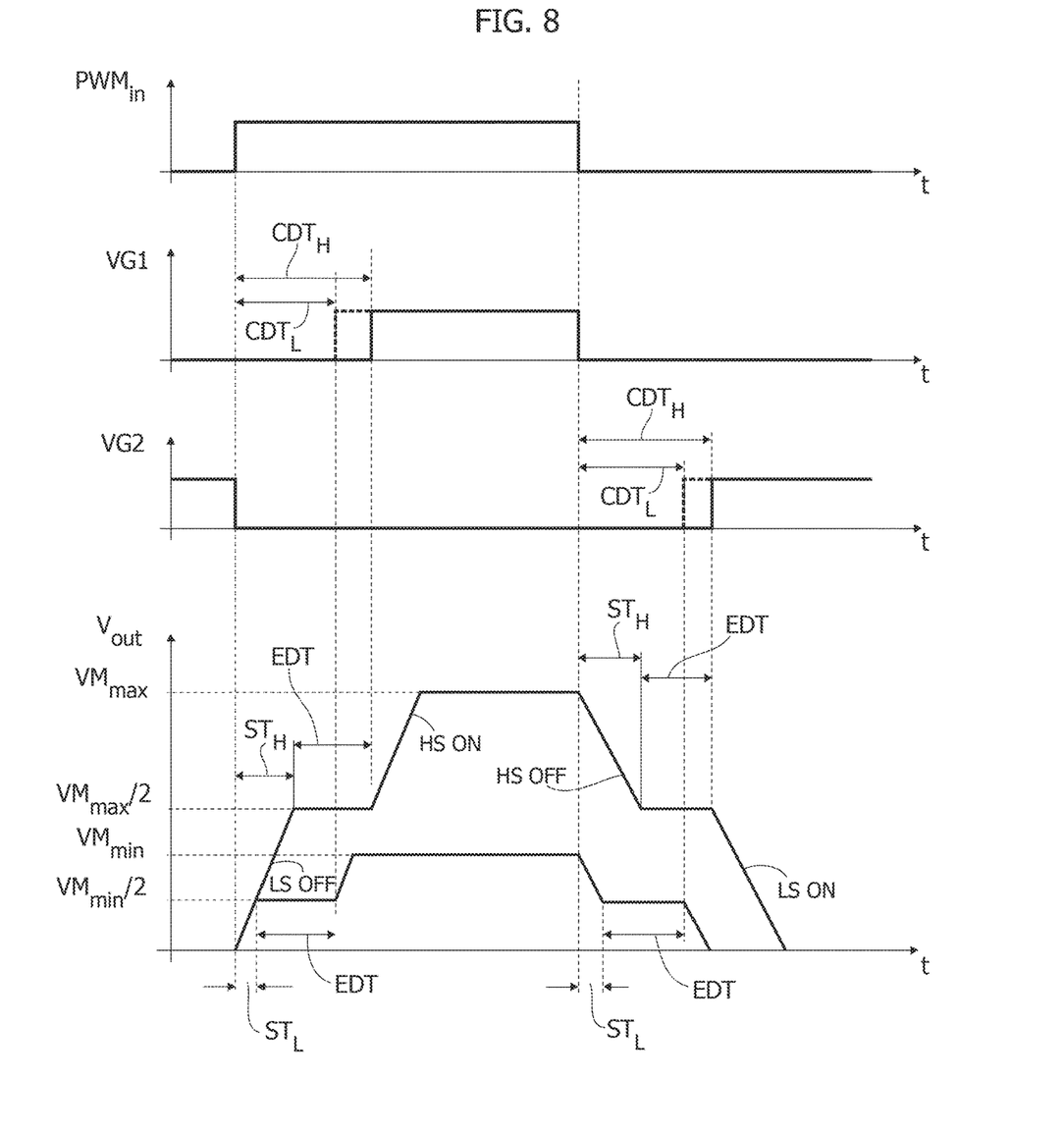
FIG. 8 is a diagram exemplary of possible time behavior of signals in embodiments of the present disclosure.

Possible time behavior of signals in a driving circuit 100 as exemplified in FIG. 6 exploiting dead time circuit blocks 6a, 6b based on a logic architecture as exemplified in FIG. 7 are exemplified in FIG. 8.

In such case, a rising edge of the input signal $PWM_{in}$, resulting in a falling edge of the signal $\overline{PWM_{in}}$, may trigger (almost immediately) an on-to-off transition of the low-side transistor M2, thus letting the output voltage $V_{out}$ increase from 0 V to VM/2. While increasing from 0 V to VM/2, the output V62 of the comparator 62 comprised in the dead time circuit block 6a may be high, thus the input signal $PWM_{in}$ may not propagate to the node V1. The output voltage $V_{out}$ reaching the value VM/2 and stabilizing may be indicative of the low-side transistor M2 having completed the on-to-off transition, and may cause the output V62 of the comparator 62 comprised in the dead time circuit block 6a to change to a low value, thus resulting in the propagation of the input signal $PWM_{in}$, delayed by an amount EDT determined by circuit block 64, to the node V1, and consequently to the node VG1. Delayed propagation of the signal $PWM_{in}$ to the node VG1 may cause the high-side transistor M1 to switch on.

Similarly, a falling edge of the input signal $PWM_{in}$ may trigger (almost immediately) an on-to-off transition of the high-side transistor M1, thus letting the output voltage $V_{out}$ decrease from VM to VM/2. While decreasing from VM to VM/2, the output V62 of the comparator 62 comprised in the dead time circuit block 6b may be high, thus the input signal may not $\overline{PWM_{in}}$ propagate to the node V2. The output voltage $V_{out}$ decreasing to the value VM/2 and stabilizing may be indicative of the high-side transistor M1 having completed the on-to-off transition, and may cause the output V62 of the comparator 62 comprised in the dead time circuit block 6b to change to a low value, thus resulting in the propagation of the input signal $\overline{PWM_{in}}$, delayed by an amount EDT determined by circuit block 64, to the node V2. Delayed propagation of the signal $\overline{PWM_{in}}$ to the node V2 may cause the low-side transistor M2 to switch on.

In one or more embodiments, the control dead time CDT may be adapted "on-the-fly", being related to the sum of a constant dead time EDT as provided by the delay circuit block 64 and of a variable dead time which is a function of the switching times ST of transistors M1, M2.

Therefore, the control dead time may be longer or shorter (e.g., $CDT_H$, resp. $CDT_L$) for, e.g., higher or lower, respectively, values of the supply voltage VM as exemplified in FIG. 8, resulting in an effective dead time EDT which is not dependent on the value of the supply voltage VM.

The effective dead time EDT being not dependent on the supply voltage VM may be advantageous, since this may facilitate controlling and tuning the power efficiency of the driver-motor system.

For instance, the effective dead time EDT as provided by the delay circuit block 64 may be set to such a small value that the high-side or low-side transistor switches on shortly after the low-side or high-side transistor in the half-bridge completes the on-to-off transition, thereby reducing the power dissipation in the body diodes D1, D2.

Figure 9:
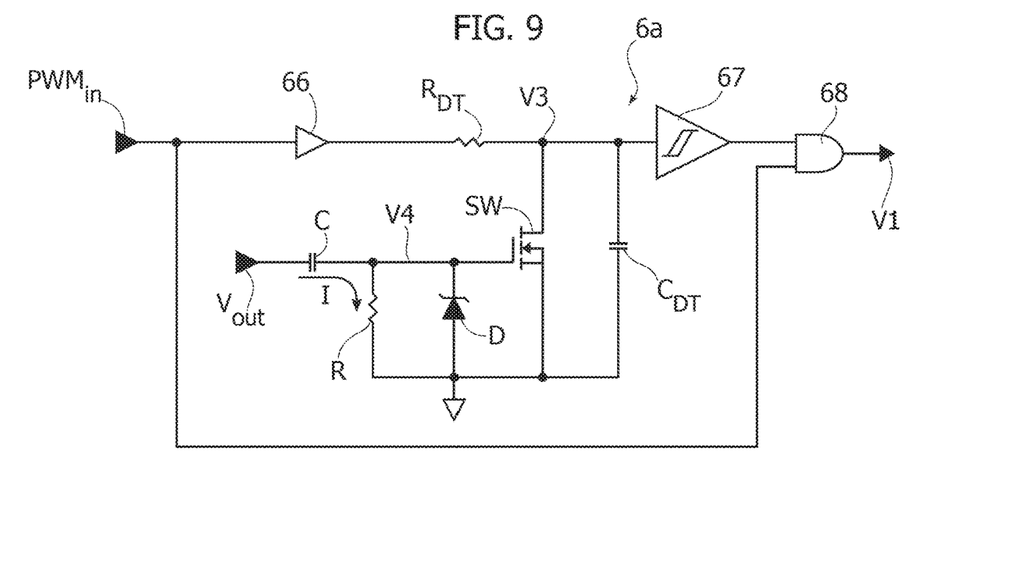
FIG. 9 is exemplary of possible implementation details of embodiments of the present disclosure.

FIG. 9 is a circuit diagram of a possible implementation of embodiments. Such circuit may facilitate the propagation of an input signal $PWM_{in}$ to the output node V1, with the propagation of a high logic value being delayed as a result of the input signal $V_{out}$ increasing, therefore providing a dead time circuit for use, e.g., in a dead time circuit block such as 6a.

A circuit as exemplified in FIG. 9 comprises a first input node $PWM_{in}$ and a second (feedback) input node $V_{out}$. A buffer 66 is coupled to the input node $PWM_{in}$. A resistive element $R_{DT}$ has one terminal coupled to the output of the buffer 66, and the other terminal defining a node V3 in the circuit. A non-inverting Schmitt trigger circuit 67 is coupled to the node V3, and provides its output to a first input of an AND logic gate 68. Such AND logic gate 68 provides an output signal at the output node V1 of the circuit 6a. A capacitive element C has a first terminal coupled to the input node $V_{out}$, and a second terminal defining a node V4 in the circuit. A resistive element R is coupled between the node V4 and ground, in parallel to a Zener diode D having its anode coupled to ground and its cathode coupled to the node V4. An n-type MOS transistor SW has its current path between the node V3 and ground, having the source node coupled to ground, the drain node coupled to the node V3, and the gate control node coupled to the node V4. A capacitive element $C_{DT}$ is coupled in parallel to the current path of the transistor SW, having one terminal coupled to the node V3 and the other terminal coupled to ground. A second input of the AND logic gate 68 is coupled to the input node $PWM_{in}$.

Figure 10A:
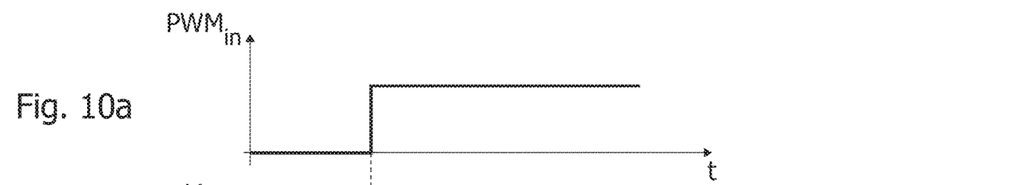
FIGS. 10a-10d are diagrams exemplary of possible time behavior of signals in embodiments of the present disclosure.
Figure 10B:
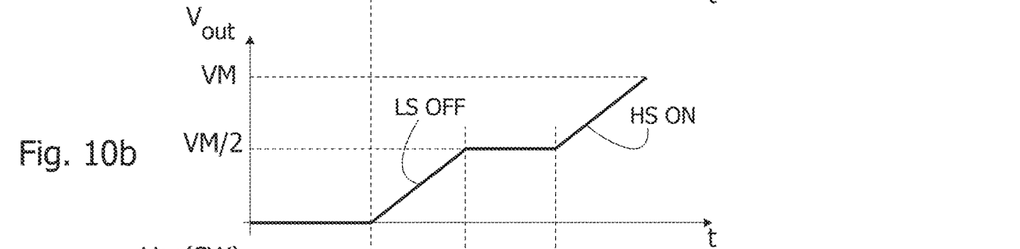
Figure 10C:
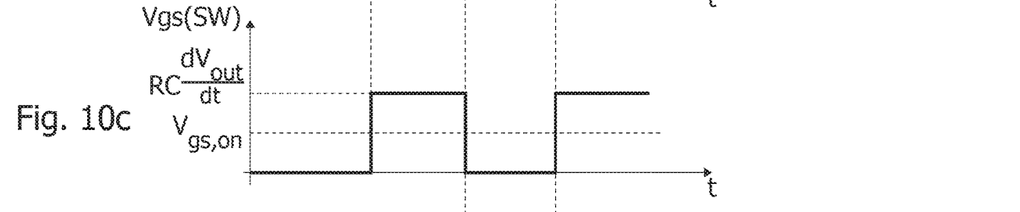
Figure 10D:
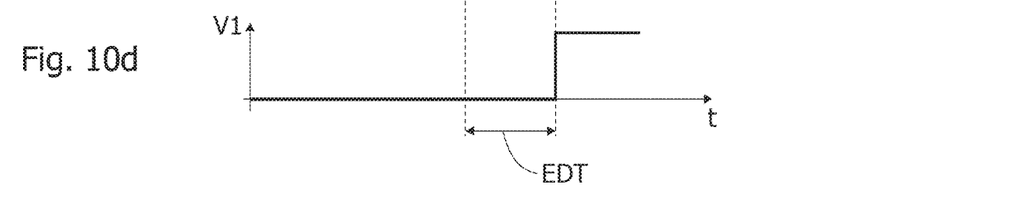

FIGS. 10a-10d are diagrams exemplary of possible time behavior of signals in a circuit as exemplified in FIG. 9, in which signals $PWM_{in}$, $V_{out}$ and V1—corresponding respectively to FIGS. 10a, 10b and 10d—are representative of signals at the respective nodes $PWM_{in}$, $V_{out}$ and V1 in FIG. 9, and signal Vgs(SW)—corresponding to FIG. 10c—is representative of the gate-to-source voltage signal of the n-type MOS transistor SW in FIG. 9.

In one or more embodiments as exemplified in FIG. 9, as a consequence of the input signal $PWM_{in}$ switching from low to high and the low-side transistor M2 starting to switch off, the signal $V_{out}$ may increase. The signal $V_{out}$ increasing may result in a (constant) current I, whose magnitude may be proportional to the rate of change (or slope) of the signal $V_{out}$, circulating across the capacitive element C from the input node $V_{out}$ to the node V4. Such current I can (only) flow through the resistive element R from node V4 to ground, thus resulting in a voltage drop across such resistive element R.

In one or more embodiments as exemplified in FIG. 9, the values of the resistive element R and of the capacitive element C may be chosen in order that the voltage drop across the resistive element R due to the current I flowing therethrough from node V4 to ground is higher than the gate-to-source threshold voltage $V_{GS,ON}$ of the transistor SW, by relying on the following relation:

$$RC > V_{GS,ON}/dV_{OUT}/dt$$

As a result of the voltage drop across the resistive element R being higher than the gate-to-source threshold voltage $V_{GS,ON}$ of the transistor SW, such transistor SW may be in a conductive state, therefore forcing node V3 to a low voltage value, e.g., close to 0 V. As a result of the voltage at node V3 being low, the output of the Schmitt trigger 67 may be low, thus resulting in the input signal PWM not being propagated to the output node V1 and forcing the output signal V1 to a low logic value.

In one or more embodiments as exemplified in FIG. 9, as a result of the low-side transistor M2 reaching the end of an on-to-off transition, the input signal $V_{out}$ may reach a certain value (e.g., the value VM/2) and stabilize thereon. Therefore, no current may flow through the capacitive element C and the resistive element R, resulting in the voltage at node V4 being close to ground voltage (e.g., 0 V). As a result of the voltage at node V4 being close to ground voltage, the gate-to-source voltage of the transistor SW may be lower than the threshold voltage $V_{GS,ON}$ and the transistor SW may be in a non-conductive state. The transistor SW being in a non-conductive state may thus result in the signal $PWM_{in}$ charging the capacitive element $C_{DT}$ through the buffer 66 and the resistive element $R_{DT}$. As a result of the voltage at node V3 reaching the upper threshold of the Schmitt trigger 67, the output of the Schmitt trigger 67 may switch to high, therefore allowing the signal $PWM_{in}$ to propagate to the output node V1 through the AND logic gate 68. Since the time necessary for node V3 to rise from ground voltage (e.g., 0 V) to the upper threshold of the Schmitt trigger 67 may depend on the values of the resistive element $R_{DT}$ and of the capacitive element $C_{DT}$, an effective dead time EDT proportional to the time constant determined by the product $R_{DT}$-$C_{DT}$ may be obtained, as exemplified in FIGS. 10a-10d.

Figure 11:
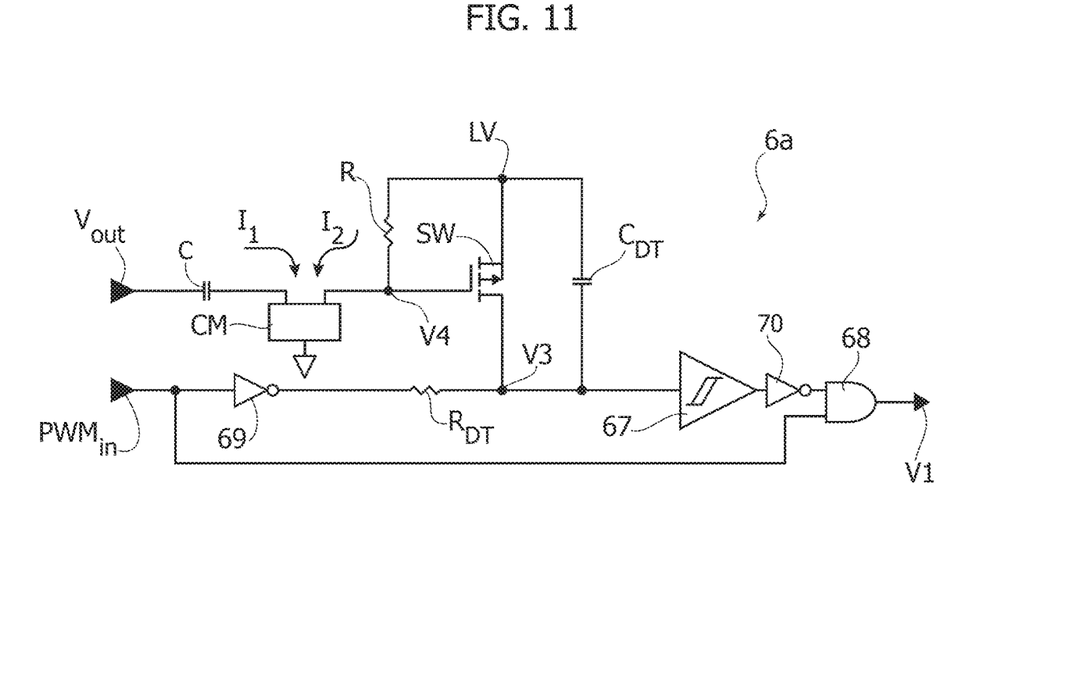
FIGS. 11 and 12 are exemplary of various possible implementation details of embodiments of the present disclosure.

FIG. 11 is a circuit diagram of a possible implementation of embodiments. A circuit as exemplified in FIG. 11 may operate according to the signals of FIGS. 10a-10d, and differs from the circuit exemplified in FIG. 9 in that it uses a p-type MOS transistor SW and a current mirror in place of the n-type transistor SW in FIG. 9.

A circuit 6a as exemplified in FIG. 11 comprises a first input node PWM and a second (feedback) input node $V_{out}$. An inverter 69 is coupled to the input node $PWM_{in}$. A resistive element $R_{DT}$ has one terminal coupled to the output of the inverter 69, and the other terminal defining a node V3 in the circuit. A non-inverting Schmitt trigger circuit 67 is coupled to the node V3 and is followed by an inverter 70. The inverter 70 provides its output to a first input of an AND logic gate 68. Such AND logic gate 68 provides an output signal at the output node V1 of the circuit 6a. A capacitive element C has a first terminal coupled to the input node $V_{out}$, and a second terminal coupled to the input node of a current mirror CM.

A current mirror is a circuit arrangement known per se, whose functionality is to sink a current from its output node, the magnitude of such current sunk from the output node being equal to the magnitude of the current being fed to the input node of the current mirror itself.

In a circuit 6a as exemplified in FIG. 11, a resistive element R is coupled between the output node of the current mirror CM and a low voltage rail LV. Such low voltage rail LV may be supplied, for instance, with a voltage value similar to the "high" value of the logic signal $PWM_{in}$. A p-type MOS transistor SW has its current path between the voltage rail LV and the node V3, having the source node coupled to the voltage rail LV, the drain node coupled to node V3, and the gate control node coupled to the output node of the current mirror CM. A capacitive element $C_{DT}$ is coupled in parallel to the current path of the transistor SW, having one terminal coupled to the voltage rail LV and the other terminal coupled to the node V3. A second input of the AND logic gate 68 is coupled to the input node $PWM_{in}$.

The circuit exemplified in FIG. 11 is a different implementation of a circuit for use as a dead time circuit block 6a, providing a functionality similar to the circuit exemplified in FIG. 9. In one or more embodiments as exemplified in FIG. 11, as a consequence of the signal $V_{out}$ increasing, a (constant) current $I_1$ may circulate across the capacitive element C from the input node $V_{out}$ to the input node of the current mirror CM. Such current $I_1$ can be mirrored by the current mirror CM, so that a current $I_2$ having the same magnitude of the current $I_1$ can flow through the resistive element R from the voltage rail LV to the output node of the current mirror CM, thus resulting in a voltage drop across such resistive element R.

In one or more embodiments as exemplified in FIG. 11, the values of the resistive element R and of the capacitive element C may be chosen in order that the voltage at the node V4 due to the current $I_2$ flowing through the resistive element R may cause the transistor SW to be in a conductive state, therefore forcing the node V3 to a high logic value (e.g., close to the voltage supplied by the voltage rail LV). As a result of the voltage at node V3 being high, the output of the Schmitt trigger 67 may be high, thus resulting in the input signal $PWM_{in}$ not being propagated to the output node V1 and forcing the output signal V1 to a low logic value.

In one or more embodiments as exemplified in FIG. 11, as a result of the input signal $V_{out}$ reaching a certain value (e.g., the value VM/2) and stabilizing thereon, no current may flow through the capacitive element C and the resistive element R, resulting in the voltage at node V4 being close to the voltage supplied by the voltage rail LV. As a result of the voltage at node V4 being close to the voltage supplied by the voltage rail LV, the transistor SW may be in a non-conductive state, thus resulting in the signal $PWM_{in}$, complemented by the inverter 69, charging the capacitive element $C_{DT}$ through the inverter 69 and the resistive element $R_{DT}$. As a result of the voltage at node V3 reaching the lower threshold of the Schmitt trigger 67, the output of the Schmitt trigger 67 may switch to low, thus resulting in the output of the inverter 70 switching to high and therefore allowing the signal $PWM_{in}$ to propagate to the output node V1 through the AND logic gate 68.

In one or more embodiments as exemplified in FIG. 11, since the time necessary for node V3 to decrease from the voltage of the voltage rail LV to the lower threshold of the Schmitt trigger 67 may depend on the values of the resistive element $R_{DT}$ and of the capacitive element $C_{DT}$, an effective dead time EDT proportional to the time constant determined by the product $R_{DT}$-$C_{DT}$ may be obtained, as exemplified in FIGS. 10a-10d.

Signals exemplified in portions a), b) and d) of FIGS. 10a-10d may be thus representative of signals at the nodes $PWM_{in}$, $V_{out}$ and V1, respectively, of a circuit as exemplified in FIG. 11.

Figure 12:
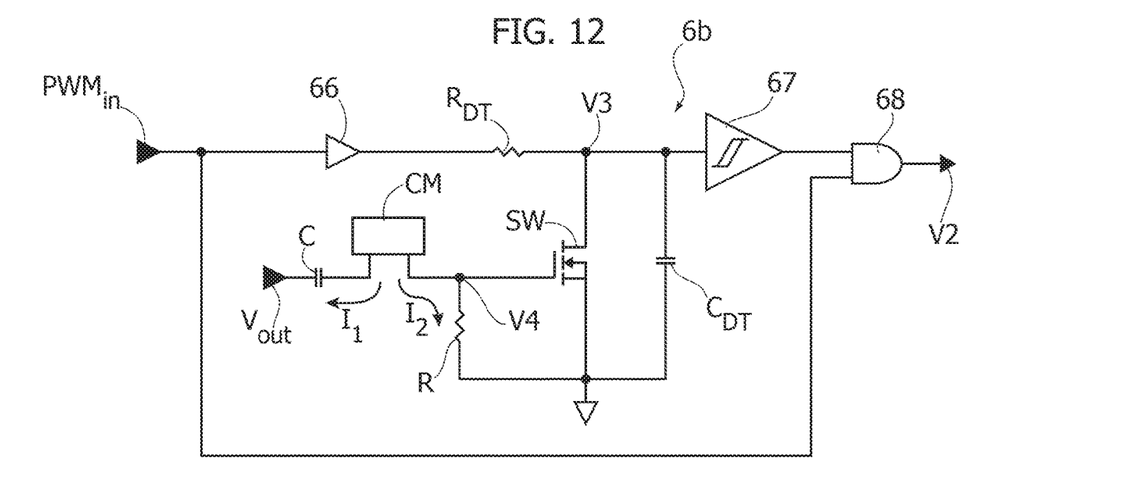

FIG. 12 is a circuit diagram of a possible implementation of embodiments. Such circuit may facilitate the propagation of an input signal $PWM_{in}$ to the output node V2, with such propagation being delayed as a result of the input signal $V_{out}$ decreasing, therefore providing a dead time circuit for use, e.g., in a dead time circuit block such as 6b.

It will be noted that a circuit as exemplified in FIG. 12 is based on an architecture similar to that exemplified in FIG. 9. A circuit as exemplified in FIG. 12 differs from a circuit as exemplified in FIG. 9 in that:
the capacitive element C has a first terminal coupled to the input node $V_{out}$, and a second terminal coupled to the input node of a current mirror CM;
the output node of such current mirror CM defines a node V4 in the circuit, such node V4 being coupled to the control terminal of the transistor SW and to one terminal of the resistive element R, similarly to the circuit exemplified in FIG. 9; and
no Zener diode is coupled between node V4 and ground.

In one or more embodiments as exemplified in FIG. 12, as a result of the current $I_1$ flowing through the capacitive element C being mirrored by the current mirror CM, the circuit may behave similarly to a circuit as exemplified in FIG. 9, with the difference of allowing a (delayed) propagation of a signal from the input node $PWM_{in}$ to the output node V2 when the signal $V_{out}$ is decreasing (instead of increasing, like in a circuit as exemplified in FIG. 9).

In fact, in one or more embodiments as exemplified in FIG. 12, as a result of the signal $V_{out}$ decreasing, a (constant) current $I_1$ may circulate across the capacitive element C from the input node of the current mirror CM to the input node $V_{out}$. A mirrored current $I_2$ can (only) flow through the resistive element R from node V4 to ground, thus resulting in the circuit 6b exemplified in FIG. 12 to behave like the circuit 6a exemplified in FIG. 9, provided that the voltage $V_{out}$ is decreasing.

As exemplified in FIG. 6, a dead time circuit block 6b as exemplified in FIG. 12 may be fed with an input signal $PWM_{in}$ complemented by the inverter 9. Therefore, operation according to the signals exemplified in FIG. 8 and FIGS. 13a-13d can be achieved.

Figure 13A:
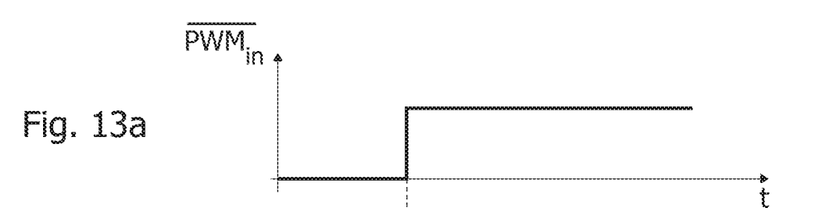
FIGS. 13a-13d are diagrams exemplary of possible time behavior of signals in embodiments of the present disclosure.
Figure 13B:
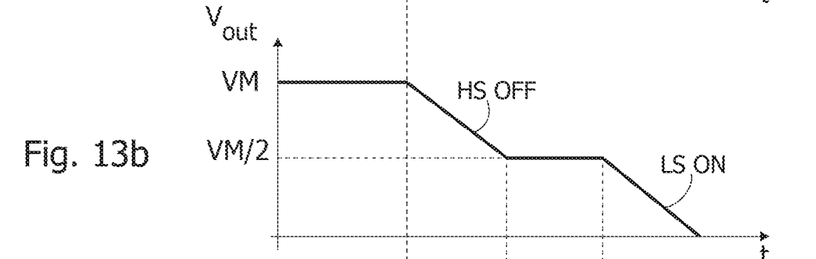
Figure 13C:
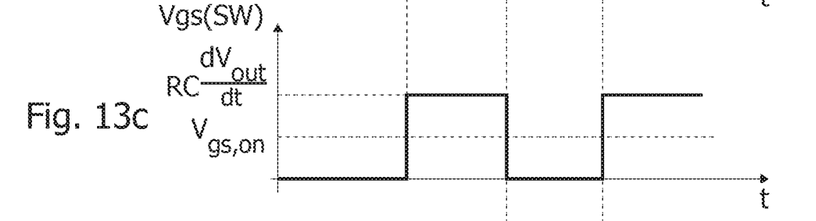
Figure 13D:
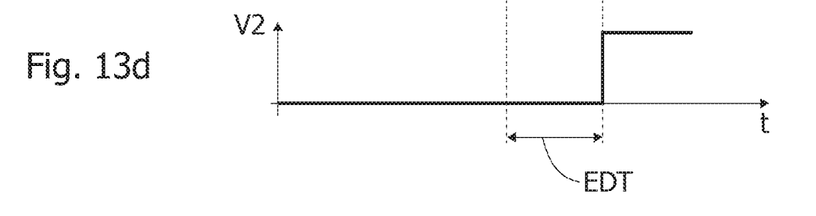

FIGS. 13a-13d is a diagram exemplary of possible time behavior of signals in a circuit as exemplified in FIG. 12, in which signals $\overline{PWM_{in}}$, $V_{out}$ and V2—corresponding respectively to FIGS. 13a, 13b and 13d—are representative of signals at the respective nodes $PWM_{in}$, $V_{out}$ and V2, and signal Vgs(SW)—corresponding to FIG. 13c—is representative of the gate-to-source voltage signal of the n-type MOS transistor SW.

Figure 14:
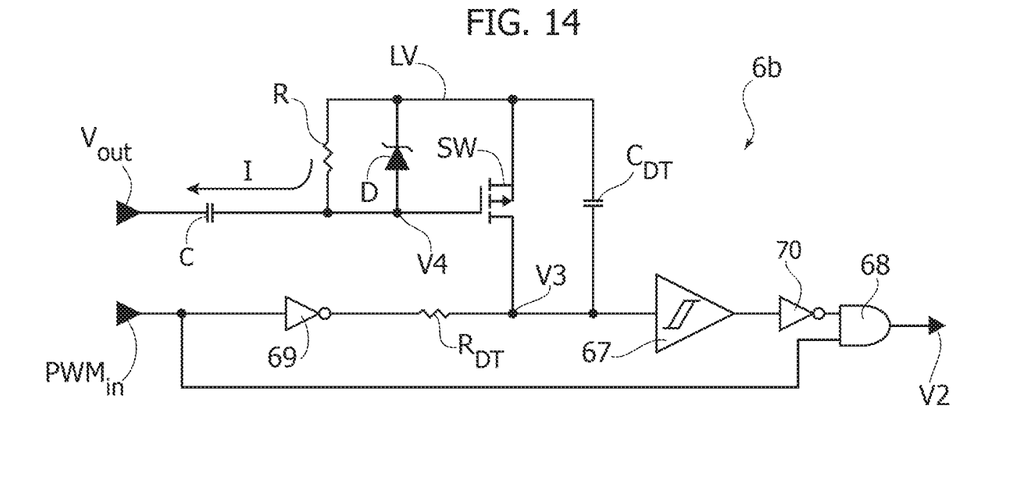
FIG. 14 is exemplary of possible implementation details of embodiments of the present disclosure.

FIG. 14 is a circuit diagram of a possible implementation of embodiments. A circuit as exemplified in FIG. 14 may operate according to the signals of FIGS. 13a-13d, and differs from the circuit exemplified in FIG. 12 in that it uses a p-type MOS transistor SW in place of an n-type transistor and a current mirror.

It will be noted that a circuit as exemplified in FIG. 14 is based on an architecture similar to that exemplified in FIG. 11. A circuit as exemplified in FIG. 14 differs from a circuit as exemplified in FIG. 11 in that:
- no current mirror is present between the capacitive element C and the resistive element R;
- the capacitive element C has a first terminal coupled to the input node $V_{out}$, and a second terminal coupled to the gate control terminal of the p-type transistor SW; and
- the resistive element R and a Zener diode D are coupled in parallel between the low voltage supply rail LV and the gate control terminal of the p-type transistor SW, the Zener diode having its cathode coupled to the low voltage supply rail LV and its anode coupled to the control terminal of the p-type transistor SW.

In one or more embodiments as exemplified in FIG. 14, as a result of the current I flowing through the capacitive element C from node V4 to the input node $V_{out}$ when the voltage $V_{out}$ decreases, the circuit may behave similarly to a circuit as exemplified in FIG. 11, with the difference of allowing a (delayed) propagation of a signal from the input node $PWM_{in}$ to the output node V2 when the signal $V_{out}$ is decreasing.

It will be noted that transistor SW as exemplified in FIGS. 9, 11, 12, 14 may be replaced by any type of electronic switch having similar switching logic.

In one or more embodiments, a circuit (e.g., 6) may comprise:
- an output node (e.g., V) couplable to the control terminal (e.g., VG1, VG2) of a respective one of the high-side electronic switch (e.g., M1) or the low-side electronic switch (e.g., M2) in a half-bridge arrangement (e.g., FIB) including an intermediate node between the high-side electronic switch and the low-side electronic switch;
- a first input node (e.g., $PWM_{in}$) configured to receive a PWM-modulated control signal for the respective one of the high-side electronic switch or the low-side electronic switch;
- a second input node (e.g., $V_{out}$) configured to be coupled to the intermediate node in the half-bridge arrangement;
- a signal propagation path from the first input node to the output node, the signal propagation path switchable between a first non-conductive state and a second conductive state wherein the signal at the first input node is transferred to the output node;
- a differentiator circuit block (e.g., 61, 62, 63) coupled to the second input node and to the signal propagation path from the first input node to the output node, the differentiator circuit block configured to switch the signal propagation path between the first non-conductive state and the second conductive state as a function of the time derivative of the signal at the second input node; and
- at least one time-delay circuit component configured to delay transfer of the signal at the first input node to the output node.

In one or more embodiments, the at least one time-delay circuit component may comprise time-delay circuitry (e.g., 64) coupled to the differentiator circuit block and configured to delay switching of the signal propagation path between the first non-conductive state and the second conductive state.

In one or more embodiments, the differentiator circuit block may comprise:
- a differentiator network (e.g., R, C) coupled to the second input node; and
- a comparator network (e.g., 62) configured to compare the output from the differentiator network with a reference threshold (e.g., $V_{th}$), the output from the comparator network coupled (e.g., 63, 64) to the signal propagation path and configured to switch (e.g., 65) the signal propagation path between the first non-conductive state and the second conductive state as a result of the output from the differentiator network reaching the reference threshold.

In one or more embodiments, the signal propagation path from the first input node to the output node may comprise a logic gate (e.g., 68) having a first gate input coupled to the first input node and a gate output coupled the output node as well as a second gate input selectively enabling and disabling signal propagation from the first gate input to the gate output.

In one or more embodiments, the comparator network in the differentiator circuit block may comprise an electronic switch (e.g., SW) having a control terminal driven by the differentiator network coupled to the second input node, the electronic switch switchable between a non-conductive state and a conductive state as a result of the output from the differentiator network at the control terminal of the electronic switch reaching a conduction threshold value, the electronic switch couplable to the second gate input of the logic gate, wherein signal propagation from the first gate input to the gate output of the logic gate may be enabled resp. disabled by the electronic switch in the one and the other of the non-conductive state and the conductive state.

In one or more embodiments, a delay network (e.g., $R_{DT}$, $C_{DT}$) may be provided active between the electronic switch and the second gate input of the logic gate.

In one or more embodiments, the delay network may be coupled to the first input node, wherein the delay network may be sensitive to the PWM-modulated control signal for the respective one of the high-side electronic switch (e.g., M1) or low-side electronic switch (e.g., M2).

One or more embodiments may comprise a Zener diode (e.g., D) active between the differentiator network and the control terminal of the electronic switch.

In one or more embodiments the differentiator network may comprise capacitive (e.g., C) and resistive (e.g., R) components with a current mirror circuit block (e.g., CM) therebetween.

In one or more embodiments, a driver arrangement (e.g., 100) for a half-bridge arrangement (e.g., HB) including a high-side electronic switch (e.g., M1) and a low-side electronic switch (e.g., M2) having an intermediate node (e.g., $V_{out}$) therebetween may comprise:
- a first circuit (e.g., 6a), having a first output node (e.g., V1) couplable to the control terminal (e.g., VG1) of the high-side electronic switch in the half-bridge arrangement as well as a high-side input node configured to receive a PWM-modulated control signal for the high-side electronic switch; and a second circuit (e.g., 6b), having a second output node (e.g., V2) couplable to the control terminal (e.g., VG2) of the low-side electronic switch in the half-bridge arrangement as well as a low-side input node configured to receive a PWM-modulated control signal for the low-side electronic switch.

In one or more embodiments, the first circuit and the second circuit in a driver arrangement for a half-bridge arrangement having an intermediate node may have respective second input nodes configured to be coupled to the intermediate node in the half-bridge arrangement.

In one or more embodiments, a device may comprise:

a half-bridge arrangement (e.g., HB) including a high-side electronic switch (e.g., M1) and a low-side electronic switch (e.g., M2) having an intermediate node therebetween (e.g., $V_{out}$); and a driver arrangement (e.g., 100) according to one or more embodiments, comprising:

a first circuit (e.g., 6a) having a first output node (e.g., V1) coupled to a control terminal (e.g., VG1) of the high-side electronic switch in the half-bridge arrangement;

a second circuit (e.g., 6b) having a second output node (e.g., V2) coupled to a control terminal (e.g., VG2) of the low-side electronic switch in the half-bridge arrangement; and the first circuit and the second circuit having respective second input nodes coupled to the intermediate node in the half-bridge arrangement.

In one or more embodiments, a method of operating a circuit (e.g., 6) according to one or more embodiments may comprise:

coupling an output node (e.g., V) of the circuit to a control terminal (e.g., VG1, VG2) of a respective one of the high-side electronic switch (e.g., M1) or the low-side electronic switch (e.g., M2) in a half-bridge arrangement (e.g., HB) including an intermediate node (e.g., $V_{out}$) between the high-side electronic switch and the low-side electronic switch;

receiving at the first input node (e.g., $PWM_{in}$) of the circuit a PWM-modulated control signal for the respective one of the high-side electronic switch or low-side electronic switch; and coupling the second input node of the circuit to the intermediate node in the half-bridge arrangement.

Without prejudice to the underlying principles, the details and embodiments may vary, even significantly, with respect to what has been described by way of example only, without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:

an output node couplable to a control terminal of a respective one of a high-side electronic switch or low-side electronic switch in a half-bridge arrangement including an intermediate node between the high-side electronic switch and the low-side electronic switch;

a first input node configured to receive a PWM-modulated control signal for said respective one of the high-side electronic switch or low-side electronic switch;

a second input node configured to be coupled to said intermediate node in the half-bridge arrangement; and a dead-time circuit including:

a signal propagation path from the first input node to the output node, the signal propagation path switchable between a first non-conductive state and a second conductive state wherein the PWM-modulated control signal at the first input node is transferred to the output node;

a differentiator circuit block coupled to the second input node and to the signal propagation path from the first input node to the output node, the differentiator circuit block configured to switch the signal propagation path between the first non-conductive state and the second conductive state as a function of a time derivative of a signal at said second input node, wherein the differentiator circuit block includes:

a differentiator network, including a switch, coupled to the second input node, the differentiator network having an output; and a comparator network configured to compare the output from the differentiator network with a reference threshold, an output from the comparator network coupled to the signal propagation path and configured to switch the signal propagation path between the first non-conductive state and the second conductive state as a result of the output from the differentiator network reaching the reference threshold; and at least one time-delay circuit component configured to delay transfer of the PWM-modulated control signal at the first input node to the output node.

2. The circuit of claim 1, wherein the at least one time-delay circuit component comprises time-delay circuitry coupled to the differentiator circuit block and configured to delay switching of the signal propagation path between the first non-conductive state and the second conductive state.

3. The circuit of claim 1, wherein:

the signal propagation path from the first input node to the output node comprises a logic gate having a first gate input coupled to the first input node and a gate output coupled the output node, and a second gate input selectively enabling and disabling signal propagation from the first gate input to the gate output;

the comparator network in the differentiator circuit block comprises an electronic switch having a control terminal driven by the differentiator network coupled to the second input node, the electronic switch switchable between a non-conductive state and a conductive state as a result of the output from the differentiator network at the control terminal of the electronic switch reaching a conduction threshold value, the electronic switch coupled to the second gate input of the logic gate, wherein signal propagation from the first gate input to the gate output of the logic gate is enabled and disabled by the electronic switch in said non-conductive state and said conductive state, respectively; and a delay network between the electronic switch and the second gate input of the logic gate.

4. The circuit of claim 3, wherein the delay network is coupled to the first input node, wherein the delay network is sensitive to said PWM-modulated control signal for said respective one of the high-side electronic switch or low-side electronic switch.

5. The circuit of claim 4, comprising a Zener diode active between the differentiator network and the control terminal of the electronic switch.

6. The circuit of claim 4, wherein the differentiator network comprises capacitive and resistive components with a current mirror circuit block therebetween.

7. A driver arrangement, comprising:
a first circuit having a first output node couplable to a control terminal of a high-side electronic switch in a half-bridge arrangement, the first circuit including a high-side input node configured to receive a PWM-modulated control signal for the high-side electronic switch, the first circuit including a second input node configured to be coupled to an intermediate node between the high-side electronic switch and a low-side electronic switch in the half-bridge arrangement;
a second circuit having a second output node couplable to a control terminal of the low-side electronic switch in the half-bridge arrangement, the second circuit including a low-side input node configured to receive a PWM-modulated control signal for the low-side electronic switch, the second circuit including a second input node configured to be coupled to the intermediate node; and
wherein each of the first and second circuits comprises a dead-time circuit including:
a signal propagation path from the corresponding high-side or low-side input node to the corresponding first or second output node, the signal propagation path configured to switch between a first non-conductive state and a second conductive state, wherein the corresponding PWM-modulated control signal is transferred to the first or second output node in the second conductive state;
a differentiator circuit coupled to the corresponding second input node and to the signal propagation path, the differentiator circuit configured to switch the signal propagation path between the first non-conductive state and the second conductive state in response to a time derivative of a signal at the second input node; and
a time-delay circuit configured to delay transfer of the corresponding PWM-modulated control signal at the corresponding first input node to the corresponding output node.

8. The driver arrangement of claim 7, wherein the time-delay circuit comprises time-delay circuitry coupled to the differentiator circuit and configured to provide a time delay in switching the signal propagation path between the first non-conductive state and the second conductive state.

9. The driver arrangement of claim 8, wherein the differentiator circuit comprises:
a differentiator network coupled to the second input node, the differentiator network configured to generate an differentiator output signal indicating a time derivate of the signal on the second input node; and
a comparator having a first input coupled to the differentiator network to receive the differentiator output signal and a second input coupled to receive a reference threshold signal, the comparator having an output coupled to the signal propagation path to control switching of the signal propagation path between the first non-conductive state and the second conductive state based on the differentiator output signal reaching the reference threshold signal.

10. The driver arrangement of claim 9, wherein each signal propagation path comprises a logic gate having a first gate input coupled to the corresponding low-side or high-side input node and the corresponding first or second output node, and the logic gate including a second input coupled to the output of the comparator.

11. The driver arrangement of claim 7, wherein the differentiator circuit comprises a resistive element and a capacitive element.

12. The driver arrangement of claim 11, wherein the differentiator circuit further comprises a current mirror coupled between the resistive and capacitive elements.

13. The driver arrangement of claim 7, wherein the differentiator circuit is configured to generate an output signal indicating whether one of the two transistors high-side and low-side electronic switches is operating an on-to-off transition mode and whether a signal on the intermediate is constant.

14. A method of controlling a high-side electronic switch and a low-side electronic switch of a half-bridge circuit including an intermediate node between the high-side and the low-side electronic switches, the method comprising:
receiving, at a first input node, a transition of a PWM-modulated control signal for a respective one of the high-side and low-side electronic switches;
generating, by a differentiator network including a switch, a differentiator signal indicating a time derivative of a signal on the intermediate node, the differentiator network having an input coupled to the intermediate node and an output;
comparing, by a comparator network coupled to a signal propagation path, the output from the differentiator network with a reference threshold;
providing, by the comparator network, an output operative to switch the signal propagation path between a first non-conductive state and a second conductive state as a result of the output from the differentiator network reaching the reference threshold;
generating a dead-time delay based on the differentiator signal; and
providing the transition of the PWM-modulated control signal to a respective one of the high-side and low-side electronic switches the dead-time delay after receiving the transition of the PWM-modulated control signal.

15. The method of claim 14, wherein the PWM-modulated control signal includes high-to-low and high-to-low transitions, and wherein the method further comprises providing high-to-low transitions of the PWM-modulated control signal to the respective one of the high-side and low side electronic switches without the dead-time delay.

16. The method of claim 14, wherein the differentiator signal indicates the signal on the intermediate node is approximately constant.

17. The method of claim 14, wherein the differentiator signal indicates one of the high-side and low-side switches is operating in an on-to-off transition mode of operation.

18. The method of claim 14, wherein generating a differentiator signal indicating a time derivative of a signal on the intermediate node comprises applying the differentiator to an RC network.

19. The method of claim 14 further comprising:
generating an enable signal based on the differentiator signal; and gating the enable signal with the PWM-modulated control signal to provide the transition of the PWM-modulated control signal to the respective one of the high-side and low-side electronic switches the dead-time delay after receiving the transition of the PWM-modulated control signal.

\* \* \* \* \*